US006791403B1

(12) United States Patent
Tayrani et al.

(10) Patent No.: US 6,791,403 B1
(45) Date of Patent: Sep. 14, 2004

(54) MINIATURE RF STRIPLINE LINEAR PHASE FILTERS

(75) Inventors: Reza Tayrani, Marina Del Ray, CA (US); Larry Dalconzo, Los Angeles, CA (US); David J. Drapeau, Los Angeles, CA (US); Ron K. Nakahira, Buena Park, CA (US)

(73) Assignee: Raytheon Company, Waltham, MA (US)

( * ) Notice: Subject to any disclaimer, the term of this patent is extended or adjusted under 35 U.S.C. 154(b) by 36 days.

(21) Appl. No.: 10/392,142

(22) Filed: Mar. 19, 2003

(51) Int. Cl.[7] .................................................. H01L 25/00
(52) U.S. Cl. ........................................ 327/565; 327/551
(58) Field of Search ................................ 327/551, 552, 327/558, 559, 564, 565, 566

(56) References Cited

U.S. PATENT DOCUMENTS 5,489,881 A * 2/1996 Yuda et al. ................. 333/203
6,645,896 B2 * 11/2003 Okamoto et al. ........... 501/136
6,728,092 B2 * 4/2004 Hunt et al. ................. 361/303
6,741,148 B2 * 5/2004 Killen et al. ................ 333/203

OTHER PUBLICATIONS

"Compact Forward–Coupled Superconducting Microstrip Filters for Cellular Communication," IEEE Transactions on Applied Superconductivity, vol. 5, No. 2, Jun. 1995, pp 2656–2659.

Data Sheet (2 pages), REMEC Microwave Products, Surface Mount Lumped Element Filters.

Data Sheet (4 pages), 2001 Superconductor Technologies, Inc., Superfilter II, Superconductor Technologies.

* cited by examiner

*Primary Examiner*—Jeffrey Zweizig
(74) *Attorney, Agent, or Firm*—Leonard A. Alkov

(57) ABSTRACT

RF filter circuits are described which include a bottom dielectric substrate fabricated of a high dielectric material having a relative dielectric constant in a range of 30 to 100. A conductor pattern defining a circuit topology is fabricated on a surface of the substrate.

27 Claims, 4 Drawing Sheets

MINIATURE RF STRIPLINE LINEAR PHASE FILTERS

BACKGROUND OF THE DISCLOSURE

Low cost, low weight and high performance integrated filter banks are critical components of, e.g., advanced channelized receiver and exciter modules. These require miniaturized low-cost filter technology offering excellent performance, as well as high manufacturing yield to reduce costs.

Currently the production miniature UHF, RF, and microwave circuits, especially filters, are based on "lumped element" technology where lumped capacitors ("Cs") and inductors ("Ls") are used to construct a filter. Such filters are expensive due, e.g., to the extensive to tuning time needed to tune each filter. Furthermore, such filters require a relatively large foot print, a high Z dimensional height and are relatively heavy.

Another approach for filter miniaturization utilizes Lanthanum Aluminate ($LaAIO_3$) substrates with an assumed relative dielectric constant of $\epsilon_r$=24. These types of material have in the past only been used in the growth of low temperature superconducting ("LTS") films. Such substrates are expensive, suffer from a high dislocation density, and have a rather low dielectric constant, e.g., $\epsilon_r$=<24. They have been limited in effectiveness, e.g., to certain space applications where small cryogenic refrigeration capabilities exists, where such distributed small filters have played an important role, albeit at a considerable cost, as discussed in "Compact Forward-Coupled Superconducting Microstrip Filters for Cellular Communication," IEEE Transactions on Applied Superconducting, Volume 5, No. 2, 1995, pages 2656–2659.

Current Multi-Chip-Microwave-Modules are based on Alumina, Duroid or low temperature co-fired ceramic (LTCC) material. In general, the surface morphology of known thick film metallization is not very smooth due to the rather large grain size of the conductor paste.

Complex multi-layer fabrication technology generally requires a dielectric interposer-layer, sometimes called dielectric lamination layer, either as part of the microwave/RF circuit topology or as the means of physically separating the RF conducting layers from the control DC circuitry or both. Stripline RF and microwave circuits also need a lamination layer that is electrically part of the circuit dielectric layer, meaning that such layer has to have a low loss tangent (high Q) and a consistently high dielectric constant $\epsilon_r$, e.g., greater than or equal to 100.

SUMMARY OF THE DISCLOSURE

RF filter circuits are described which include a bottom dielectric substrate fabricated of a high dielectric material having a relative dielectric constant in a range of 30 to 100. A conductor pattern defining a circuit topology is fabricated on a surface of the substrate.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE DISCLOSURE

Figure 1A:
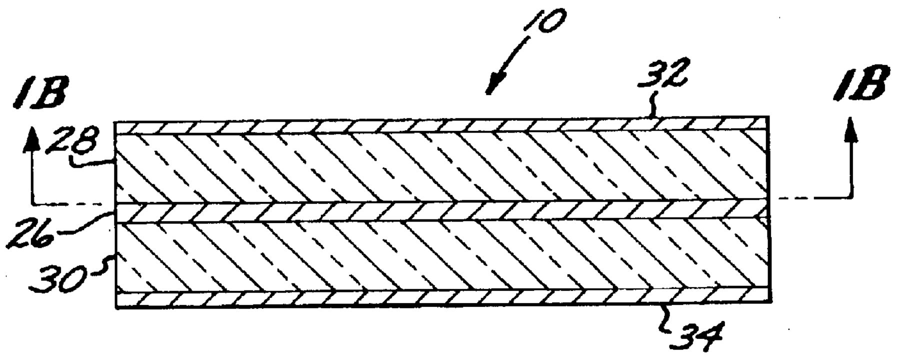
FIG. 1A is a simplified cross-sectional view of an embodiment of a stripline filter circuit in accordance with the invention.

An embodiment of the present invention provides a new class of miniature RF/Microwave stripline filters, and in general, to a new class of miniature and compact UHF, RF and microwave circuits and MICs including complex multilayer multi-chip modules ("MCMs") realizable on high dielectric ceramics having a high dielectric constant in the range of 30.0.0 to 100.0. The invention in one embodiment utilizes "distributed elements" on high dielectric constant ceramics having a dielectric constant in the range of 30–100 to achieve miniature RF/microwave circuits. A multi-layer thick-film process for the fabrication of such circuits on high dielectric constant ceramics is described in an embodiment of the present invention.

Embodiments of the present invention include one or more of the features of:

- a new design for stripline linear phase bandpass ("BP") filters, capable of producing an improved filter response when compared with the conventional filters having transfer functions such as Bessel and/or Gaussian;
- identification, and application of a suitable high dielectric ceramic material having a dielectric constant in the range of 30 and 100;
- development of a detailed thick film technology including a new paste or ink with higher conductivity, a new laser via and a new laser window technology, capable of producing a new thick film low loss laminated layer technology necessary for the fabrication of stripline filters and other stripline circuits;
- a wrap-around-ground design suitable for stripline circuit technology.

It is a common misconception that, since both the length and the width of a microstrip line/stripline are reduced when using a high dielectric constant substrate, the resulting reduction in line width will increase the microwave loss (insertion loss) of the circuit. In the majority of cases, the reduction in length will compensate for extra loss associated with the reduction in the conductor width. The performance of a ($\frac{1}{4}\lambda_g$@5 Ghz) length of a 50 ohm microstrip line has been simulated on three different substrates, namely, a high dielectric constant material with an $\epsilon_r$ which is in the range of about 30–100, e.g., in one embodiment, a ceramic composed of a compound of zirconium-titanate high dielectric ceramic, produced by Countis Laboratories under the product name CD-40. The results of a simulation of a comparison of a filter element made utilizing such a ceramic, e.g., with an $\epsilon_r$=39, Alumina having an $\epsilon_r$=9.9, and Duroid having an $\epsilon_r$=2.99 is shown in Table 1, which summarizes the result of this simulation illustrating that although the high dielectric material has the highest conductor loss (dB/inch), its total line loss (insertion loss) is almost the same as the other two lines. This is, at least in part, because of the three-fold reduction in the length of the high dielectric line compared with, e.g., a Duroid line. The table shows the simulation data performed on microstrip lines rather than striplines. $\epsilon_{r\ eff}$ is different from $\epsilon_r$ because in microstrip lines the propagation mode is not true TEM (due to the inhomogeneous medium, i.e., the air interface), but is only a quasi-TEM. However, in striplines, the medium is homogeneous and supports a true TEM field; therefore $\epsilon_r$ can describe its behavior. There is a need for the definition of an effective dielectric constant which would take into account the fringing field effects. The difference between $\epsilon_r$ and $\epsilon_{r\ eff}$ is determined by a so-called "filling factor." The metal thickness for Duroid was simulated at 0.4 mil and for the other two substrates at 0.2 mil.

Figure 1B:
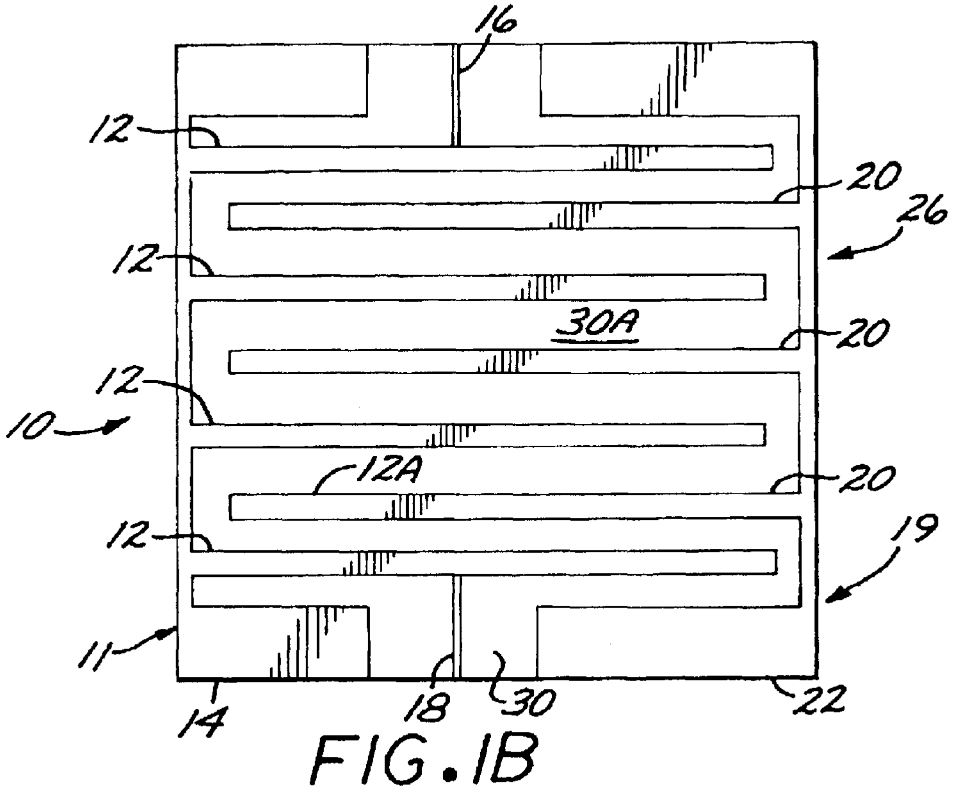
FIG. 1B is a schematic top view of the circuit of FIG. 1A, taken with the top substrate removed to illustrate an exemplary interdigital circuit pattern with a wrap-around ground structure.

FIG. 1B is a schematic top view of the structure, with the top substrate 28 removed as illustrated by line 1B—1B of FIG. 1A. FIG. 1B illustrates the exemplary conductor pattern 26 for this embodiment of the invention. The pattern 26 includes a first pattern portion 11 and a second pattern portion 19. The filter circuit 10 has an input/output (I/O) port 16 and an I/O port 18. The first pattern portion 11 includes a plurality of transverse stripline fingers 12 electrically connected to a first wrap around ground plane portion 14, and the I/O ports 16, 18. The second pattern portion 19 includes a plurality of transverse stripline fingers 20 connected to a wrap around ground plane portion 22. The stripline fingers 12 of the first pattern portion 11 are interleaved with the stripline fingers 20 of the second pattern portion 19. Conductive outer layers 32, 34 are formed on outer surfaces of the substrates 28, 30 to serve as filter circuit ground planes.

| Sub. Material | W mil | W/H | $\epsilon_{r\ eff}$ | Dielectric Loss dB/inch | Conductor Loss dB/inch | Total Loss dB/inch | Length @ 5 GHZ (mil) | Line Loss @ 5 GHZ |
|---|---|---|---|---|---|---|---|---|
| ZT-39 50 mil | 9 | 0.18 | 23.3 | 0.03 | 0.2 | 0.23 | 122 | .028 dB |
| Alumina 25 mil | 23.8 | .95 | 6.7 | 0.003 | 0.1 | 0.1 | 228 | .022 dB |
| Duroid 25 mil | 62 | 2.5 | 2.4 | 0.016 | .04** | .06 | 378 | .022 dB |

An embodiment of the present invention relates to a new design for a resonator which may be used, e.g., in a linear phase band pass ("BP") filter, in general, and more specifically related to the fabrication of such circuits and filters on high dielectric ceramic substrates. Conventional filters have a non-linear phase versus frequency characteristic which may distort the signal. Linear phase filters, or as sometimes called constant group delay filters, have a relatively linear change of phase with frequency, and therefore do not significantly distort the signal. An embodiment is capable of yielding a filter performance that is superior to the conventional approaches that are based on Gaussian, or Bessel-Thompson. An embodiment is capable of producing a filter having, e.g., a +/−0.5 degree linear phase transfer function which has very sharp attenuation skirts while maintaining a very linear phase response within the filter passband. In one embodiment the filter topology may be, e.g., a 7-order tapped interdigital design.

By way of example, a linear-phase interdigital filter according to an embodiment of the present invention can be utilized in a radio frequency integrated filter (RFIF) microwave integrated circuit (MIC) for a microwave receiver integrated onto a microchip. Such a filter has been designed having a center frequency is around 1400 MHz with stringent phase linearity of (+/−3) degree over 100 MHz BW. The exemplary filter possesses a small footprint of (0.34"×0.34"×0.05") and has a low cost of manufacturing.

Turning now to FIGS. 1A–1B, an exemplary embodiment of a stripline filter circuit 10 in accordance with aspects of the invention is illustrated. FIG. 1A is a diagrammatic side cross-section view of the filter structure, which comprises top and bottom substrates 28, 30, with a stripline conductor pattern 26 formed on the top surface 30A of the bottom substrate 30. The substrates 28, 30 are fabricated from materials having a high dielectric constant, such as zirconium-titanate, in the range of about 30–100 $\epsilon_r$. Other materials suitable for the purpose include MgO—CaO—$TiO_2$. In one exemplary embodiment, the substrates 28, 30 have nominal thicknesses of 25 mils.

The first and second pattern portions 11, 19 may be formed utilizing well known thick film deposition techniques utilizing, e g., a fine grained gold paste, e.g., as manufactured by DuPont under the name QG150. The paste may be applied to the bottom substrate 30 and heated to set the paste, after which, as is well understood in the art, the hardened paste may be etched, using, e.g., photolithographic techniques to form the fingers 12, 20 and groundplane portions 14, 22. Alternatively, the paste may be applied to both surfaces of the substrate 30 in a two step process to form the fingers on one side and a ground plane on the other, which may also be etched to form openings to receive via connections 48, 50.

Figure 2A:
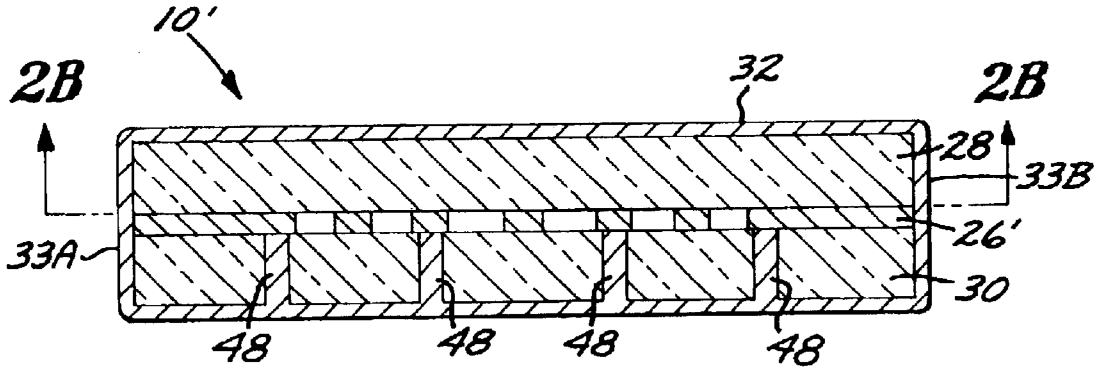
FIG. 2A is a simplified cross-sectional view of an alternate embodiment of a stripline filter circuit in accordance with the invention.
Figure 2B:
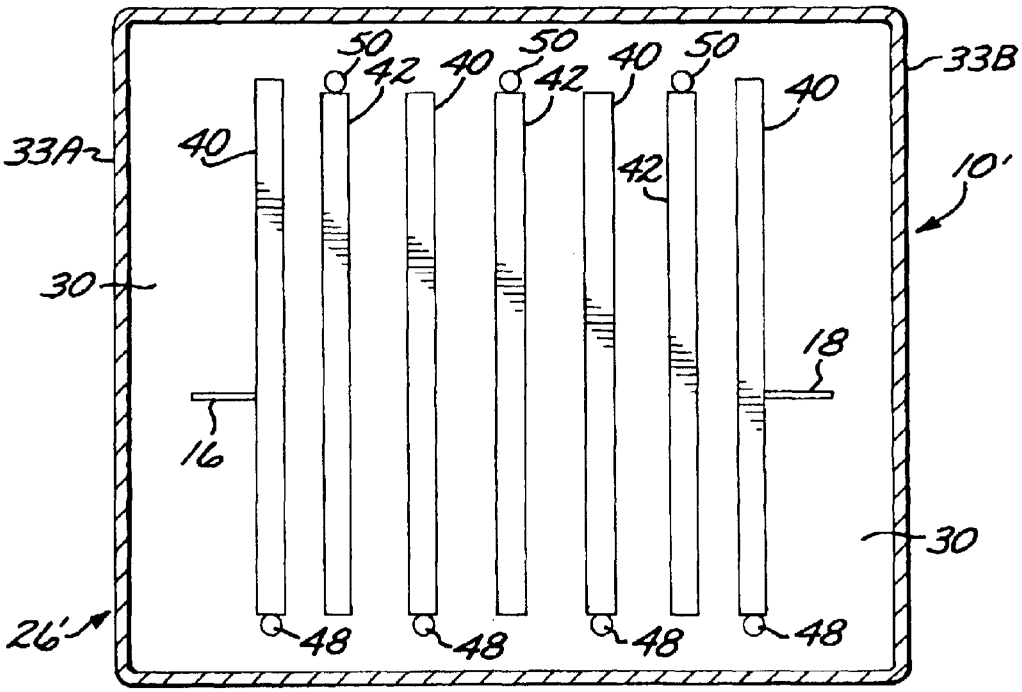
FIG. 2B is a schematic top view of the circuit of FIG. 2A, taken with the top substrate removed, which shows schematic view of a plan view of a portion of an alternative embodiment of an interdigital stripline filter.

Turning now to FIGS. 2A–2B, there is shown an alternative embodiment of a stripline filter circuit 10'. The circuit 10' includes upper and lower high dielectric substrates 28, 30 as with the embodiment of FIG. 1. The circuit 10' includes a stripline conductor pattern 26' formed on the top surface of the bottom substrate 30, which includes a plurality of transverse stripline fingers 40, each connected to ground plane 34 as shown in FIG. 2A, through vias 48, and a plurality of interleaved transverse stripline fingers 42, each connected to ground plane 34 by via connections 50. External side ground plane portions, e.g. conductor layers 33A, 33B, are formed on the side surfaces of the substrate assembly.

While the embodiments of FIGS. 1A–2B illustrate stripline RF filter circuits, microstrip RF filter circuits can also be fabricated in accordance with aspects of the invention. In this case, the top substrate 28 is omitted. The resulting microstrip circuit will provide advantages in size over conventional microstrip circuits, but will not provide miniaturization benefits as great as the stripline embodiments.

Figure 3:
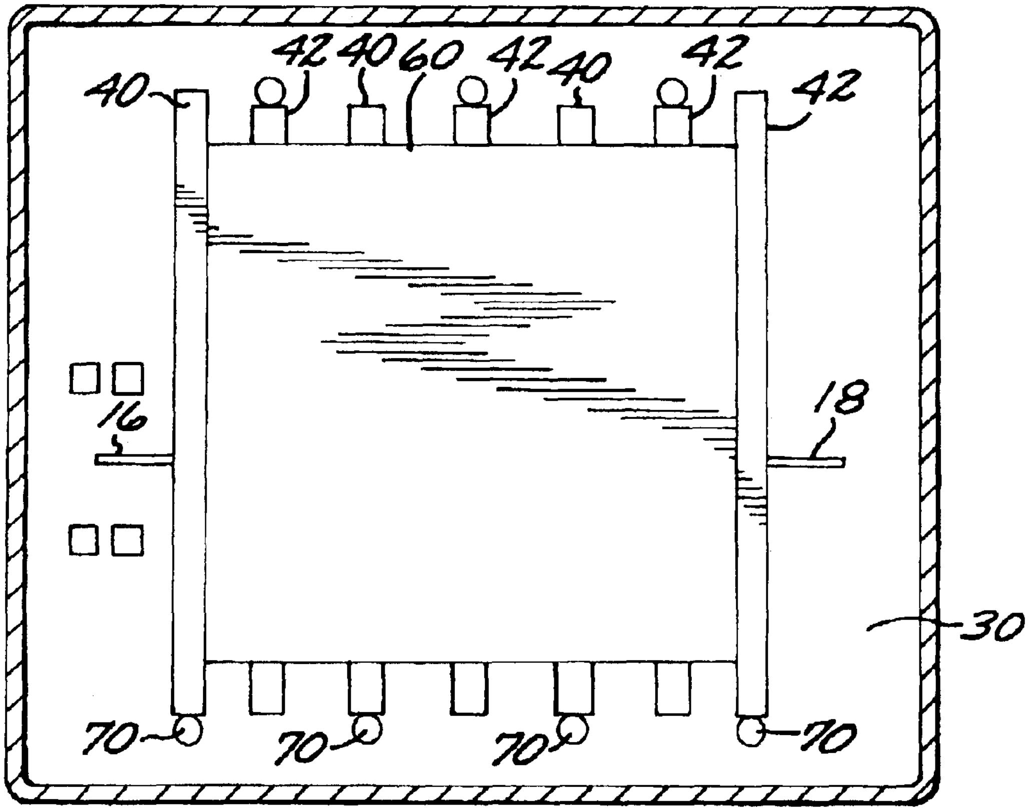
FIG. 3 illustrates the embodiment of the FIG. 2B with a thick film high dielectric laminate layer applied.

Stripline RF and microwave circuits typically utilize a lamination layer that is electrically part of the circuit dielectric layer, meaning that such layer should have a low loss tangent (high Q) and a consistent dielectric constant. A dielectric paste or ink has been identified that is suitable for application on high dielectric ceramic material. Turning now to FIG. 3, there is shown a substrate 30, e.g., of the kind shown in FIGS. 1B–2B, on which a layer 60 of high Q dielectric paste, e.g., made by Dupont under the name QM44, is applied over the fingers 40, 42 to form a laminate layer when a ceramic upper substrate layer 28 including on its surface a groundplane 32, is placed over the dielectric layer 60 and the entire assembly laminated together. As shown in FIG. 3, which illustrates an embodiment according to FIGS. 1A–1B, the dielectric layer 60 should cover substantially all of the stripline fingers 40, 42 intermediate the stripline fingers 40 connected to the input 16 and the output 18. Similarly essentially the same portions of stripline fingers 12 and 20 are covered by the dielectric paste layer 60.

Figure 4:
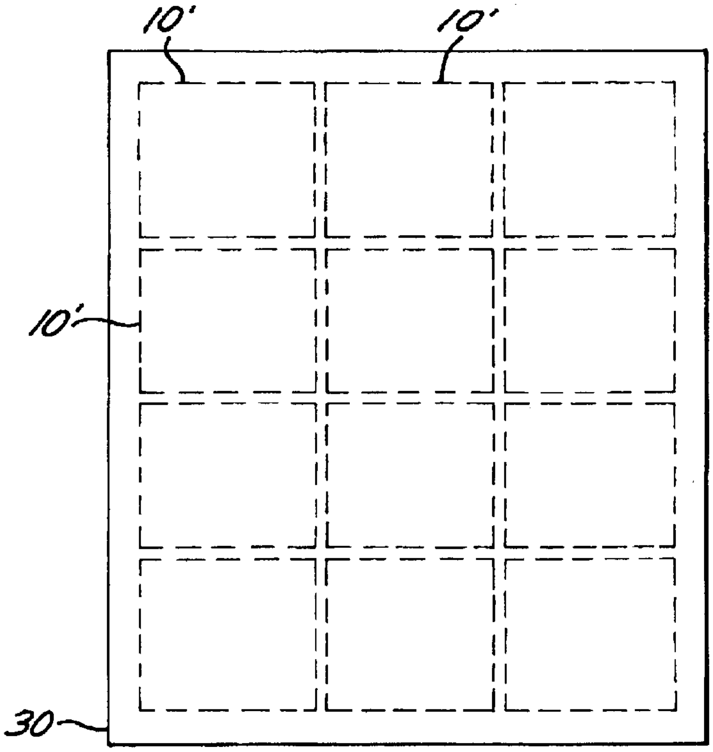
FIG. 4 shows a bottom substrate containing a plurality of interdigital stripline circuit elements, each according to the embodiment of FIGS. 1A–1B.
Figure 5:
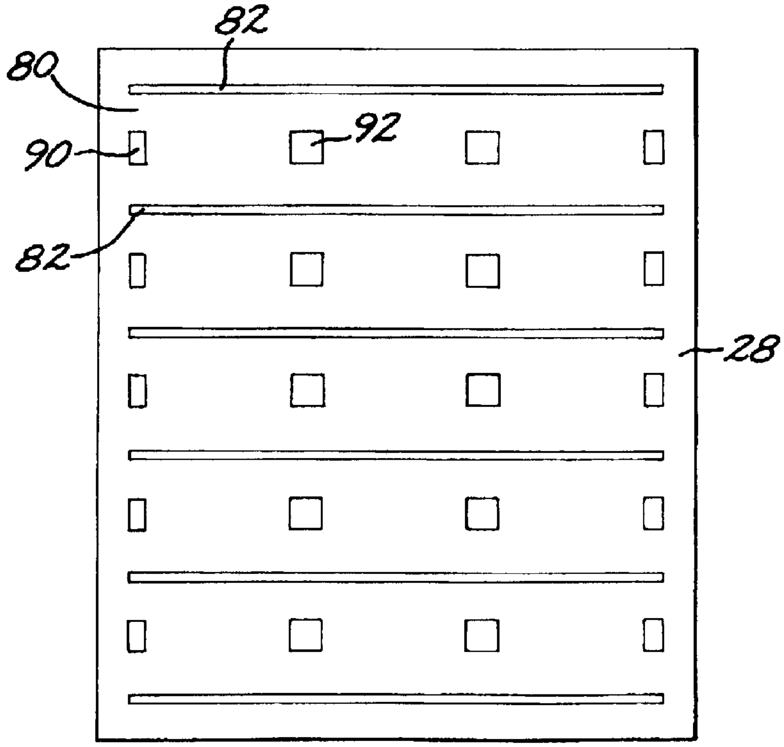
FIG. 5 shows a top substrate according to an embodiment of the present invention.

Turning now to FIGS. 4 and 5, a manner of batch fabricating embodiments of the present invention can be seen. As shown in FIG. 4, a bottom ceramic substrate 30 may have formed thereon a plurality of circuit elements 10', e.g., each including the pattern 26' as shown in FIG. 2, including vias which may be cut through the substrate 30 by any suitable means that takes into account the brittle nature of the ceramic material, e.g., by etching or laser cutting. FIG. 5 shows the top substrate 28 that is placed over the bottom substrate 30 after the application of the dielectric paste 60 and laminated to the bottom substrate 30, e.g., utilizing the dielectric paste 60 when cured as an adhesive as well as a dielectric. The top substrate 28 has a plurality of windows 90 and 92 cut through it, and a plurality of alignment slits 82 for aligning the top substrate 80 with the bottom substrate 30 during the assembly process just described. The top and bottom substrates 28, 30 can then be appropriately scored and split into a plurality of filter elements, with the windows 90 and one half of the windows 92 defining 110 openings to which connections can be made to each of the respective conductor patterns 26'.

According to an embodiment of the present invention a conductor paste was selected to not only provide a smoother surface, but also as a consequence, offer a factor of two improvement in the metal conductivity, thereby reducing the circuit losses of the RF circuitry by nearly twofold. Other associated processing steps include the optimization of the thick film's furnace temperature profile. An exemplary profile may be a linear profile, varying from room temperature to 875° C. in thirty minutes, and ramping down to room temperature in thirty minutes. Such an optimized temperature profile facilitates the utilization of the high dielectric ceramic along with the conductor paste.

Laser drilled via hole techniques are preferably employed for both the high dielectric ceramic substrates and the lamination layers to provide ground to ground interconnects or vertical interconnects between metalization layers. A laser drill recipe has been developed for cutting the window openings in the high dielectric ceramic substrates, and is used, e.g., to fabricate wrap-around-ground stripline filters in a batch mode fashion. One exemplary laser drilling process is the following. A $CO_2$ laser is programmed for the appropriate pulse power and duty cycle suitable for high dielectric ceramics. The substrate is coated with poly vinyl acetate (PVA) or other suitable water soluble coating to protect the substrate from laser slag. The coated substrate is baked at 90° C. for ten minutes. The substrate is then loaded onto the laser, and the hole pattern is laser machined. The substrate is then soaked in de-ionized water to remove the PVA, and subsequently blow-dried.

In an embodiment of the present invention a low loss dielectric paste or ink is utilized along with its processing to form layer 60. Such low loss dielectric ink is suitable for application on high dielectric ceramic material.

Embodiments of the present invention for the realization of miniature filters, e.g., an L-band bandpass filter, provide low cost and a very small footprint, through the utilization of a type of high dielectric constant ceramics that lend themselves to the inexpensive thick film processing, such as CD-40 and CD-14-available from Countis Laboratories.

According to an embodiment of the present invention, the utilization of a high dielectric constant ceramic enables miniaturization of the filter element utilizing strip lines. The materials may also be selected for fabrication of microstrip filters or other circuit components.

Thus, exemplary embodiments of the invention include a miniaturized high frequency resonance circuit and method of making such an apparatus which may comprise a resonance circuit input and a resonance circuit output; a plurality of conductive fingers formed as a thick film on a ceramic substrate having a dielectric constant of at least about 30 $\epsilon_r$ positioned transverse to the signal path through the resonance circuit from the input to the output, and interposed between a first groundplane and a second groundplane. The apparatus may also comprise a thick film dielectric layer covering and separating the stripline fingers, with each of the stripline fingers in electrical contact with at least one of the first groundplane and the second groundplane. Each of the stripline fingers may be formed on the ceramic substrate by the application of a small grain conductive metallization paste followed by hardening the paste to form a metalization layer on the ceramic substrate and the removal of portions of the metallization layer formed by the hardened paste. The dielectric lamination layer may form a thick film low loss laminated layer. At least one of the first ground plane and the second ground plane can be electrically contacted to the stripline fingers by a wrap-around portion that is formed to wrap around the sidewall of the ceramic substrate from the groundplane on one surface of the ceramic substrate to the opposite surface containing the stripline fingers.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A stripline RF filter circuit, comprising:

a bottom dielectric substrate fabricated of a high dielectric material having a relative dielectric constant in a range of 30 to 100;

a top dielectric substrate fabricated of a high dielectric material having a relative dielectric constant of at least 30;

a conductor pattern formed on the top surface of the bottom substrate, said conductor pattern defining a filter circuit pattern, a first input/output (I/O) port and a second I/O port;

the top substrate and bottom substrate sandwiching the conductor pattern to form a stripline circuit.

2. The circuit of claim 1, wherein the high dielectric material of the bottom substrate comprises zirconium-titanate or MgO—CaO—$TIO_2$.

3. The circuit of claim 1, wherein the filter circuit pattern defines an interdigital filter circuit topography.

4. The circuit of claim 1, wherein the filter has a band pass characteristic.

5. A miniaturized high frequency resonance circuit comprising:

a resonance circuit input and a resonance circuit output;

a plurality of stripline fingers formed as a thick film on a ceramic substrate having a dielectric constant of at least about 30 $\epsilon_r$ positioned transverse to the signal path through the resonance circuit from the input to the output, and interposed between a first ground plane portion and a second ground plane portion.

6. The circuit of claim 5 further comprising:

a thick film dielectric layer covering and separating the stripline fingers.

7. The circuit of claim 5 wherein:

each of the stripline fingers is in electrical contact with at least one of the first ground plane portion and the second ground plane portion.

8. The circuit of claim 5 wherein:

each of the stripline fingers is formed on the ceramic substrate by the application of a small grain conductive metalization paste followed by hardening the paste to form a metalization layer on the ceramic substrate and the removal of portions of the metalization layer formed by the hardened paste.

9. The circuit of claim 6 wherein:

the dielectric layer forms a thick film low loss laminated layer.

10. The circuit of claim 7 wherein:

at least one of the first ground plane and the second ground plane is electrically contacted to the stripline fingers by a wrap-around portion that is formed to wrap around the sidewall of the ceramic substrate from the groundplane on one surface of the ceramic substrate to an opposite surface containing the stripline fingers.

11. A multi-tapped interdigital miniaturized high frequency filter comprising:

a filter signal input and a filter signal output;

a plurality of stripline fingers formed as a thick film on a ceramic substrate having a dielectric constant of at least about 30 $\epsilon_r$ positioned transverse to the signal path through the filter from the input to the output, and interposed between a first ground plane portion and a second ground plane portion.

12. The filter of claim 11 further comprising:

a thick film dielectric layer covering and separating the stripline fingers.

13. The filter of claim 11 wherein:

each of the stripline fingers is in electrical contact with at least one of the first groundplane and the second groundplane.

14. The filter of claim 13 further comprising:

each of the stripline fingers is formed on the ceramic substrate by the application of a small grain conductive metalization paste followed by hardening the paste to form a metalization layer on the ceramic substrate and the removal of portions of the metalization layer formed by the hardened paste.

15. The filter of claim 12, wherein:

the dielectric layer forms a thick film low loss laminated layer.

16. The filter of claim 13 further comprising:

at least one of the first ground plane and the second ground plane is electrically contacted to the stripline fingers by a wrap-around portion that is formed to wrap around the sidewall of the ceramic substrate from the groundplane on one surface of the ceramic substrate to an opposite surface containing the stripline fingers.

17. An RF filter microwave integrated circuit comprising:

a filter signal input and a filter signal output;

a plurality of stripline fingers formed as a thick film on a ceramic substrate having a dielectric constant of at least about 30 $\epsilon_r$ positioned transverse to the signal path through the filter from the input to the output, and interposed between a first groundplane and a second groundplane.

18. The circuit of claim 17 further comprising:

a thick film dielectric layer covering and separating the stripline fingers.

19. The circuit of claim 17 wherein:

each of the stripline fingers is in electrical contact with at least one of the first groundplane and the second groundplane.

20. The circuit of claim 17 wherein:

each of the stripline fingers is formed on the ceramic substrate by the application of a small grain conductive metalization paste followed by hardening the paste to form a metalization layer on the ceramic substrate and the removal of portions of the metalization layer formed by the hardened paste.

21. The circuit of claim 18 wherein:

the dielectric layer forms a thick film low loss laminated layer.

22. The circuit of claim 17 further comprising:

at least one of the first ground plane and the second ground plane is electrically contacted to the stripline fingers by a wrap-around portion that is formed to wrap around the sidewall of the ceramic substrate from the ground plane on one surface of the ceramic substrate to the opposite surface containing the stripline fingers.

23. A method of forming a miniaturize high frequency resonance circuit comprising:

forming a resonance circuit input and a resonance circuit output;

forming a plurality of stripline fingers as a thick film on a ceramic substrate having a dielectric constant of at least about 30 $\epsilon_r$ positioned transverse to the signal path through the resonance circuit from the input to the output, and interposed between a first groundplane and a second groundplane.

24. The method of claim 23 further comprising:

forming a thick film dielectric layer covering and separating the stripline fingers.

25. The method of claim 23 further comprising:

forming each of the stripline fingers in electrical contact with at least one of the first ground plane and the second ground plane.

26. The method of claim 25 further comprising:

forming each of the stripline fingers on the ceramic substrate by the application of a small grain conductive metalization paste followed by hardening the paste to form a metalization layer on the ceramic substrate and the removal of portions of the metalization layer formed by the hardened paste.

27. The method of claim 24 wherein:

the dielectric layer forms a thick film low loss laminated layer.

* * * * *